United States Patent [19]

Konishi et al.

[11] Patent Number: 5,539,148
[45] Date of Patent: Jul. 23, 1996

[54] ELECTRONIC APPARATUS CASE HAVING AN ELECTRO-MAGNETIC WAVE SHIELDING STRUCTURE

[75] Inventors: Yoshihiro Konishi, Sagamihara; Shoichi Iida, Neyagawa; Mitsuyuki Oda, Neyagawa; Koji Nakamura, Neyagawa, all of Japan

[73] Assignees: Uniden Corporation, Chiba Pref.; Nippon Paint Co., Ltd., Osaka, both of Japan

[21] Appl. No.: 291,940

[22] Filed: Aug. 17, 1994

Related U.S. Application Data

[63] Continuation-in-part of Ser. No. 117,756, Sep. 8, 1993, abandoned.

[30] Foreign Application Priority Data

Sep. 11, 1992 [JP] Japan .................. 4-243654

[51] Int. Cl.⁶ ............................................. H05K 9/00
[52] U.S. Cl. .................. 174/35 R; 361/800; 361/818; 455/300
[58] Field of Search ............... 174/35 R, 35 MS; 361/800, 816, 818; 455/300

[56] References Cited

U.S. PATENT DOCUMENTS

| | | | |
|---|---|---|---|
| 3,742,176 | 6/1973 | Ishino et al. | 219/10.55 |
| 4,116,906 | 9/1978 | Ishino et al. | 260/22 |
| 4,681,712 | 7/1987 | Sakakibara et al. | 264/24 |
| 5,170,009 | 12/1992 | Kadokura | 174/35 R |
| 5,198,138 | 3/1993 | Yamamoto et al. | 252/62.54 |
| 5,260,128 | 11/1993 | Ishii et al. | 428/328 |
| 5,285,007 | 2/1994 | Deluca et al. | 174/35 R |

FOREIGN PATENT DOCUMENTS

| | | | |
|---|---|---|---|
| 0398672A1 | 11/1990 | European Pat. Off. | |
| 2855134 | 6/1979 | Germany | |
| 0271599 | 11/1990 | Japan | 361/816 |
| 0302098 | 12/1990 | Japan | 361/818 |

*Primary Examiner*—Kristine L. Kincaid
*Assistant Examiner*—Robert J. Decker
*Attorney, Agent, or Firm*—Watson Cole Stevens Davis

[57] ABSTRACT

As for an electric apparatus having a case formed of electro-magnetic wave passing-through material, in order to provide an electro-magnetic wave shielding structure being capable to effectively prevent the leakage therefrom of an electro-magnetic wave generated therein, an electro-magnetic wave reflecting layer, namely, a conductive layer is formed on an inner face of the case and further, on a surface of the conductive layer, a magnetically losing layer containing Mn—Mg—Zn group soft ferrite particles having 1 to 20 μm average diameter by 70 to 90 weight % at a thickness exceeding 80 μm is formed, so as to repeatedly absorb the inner generated undesired electro-magnetic wave therein through repeated reflection between the conductive layer and the absorbing layer.

10 Claims, 3 Drawing Sheets

FIG_1
PRIOR ART
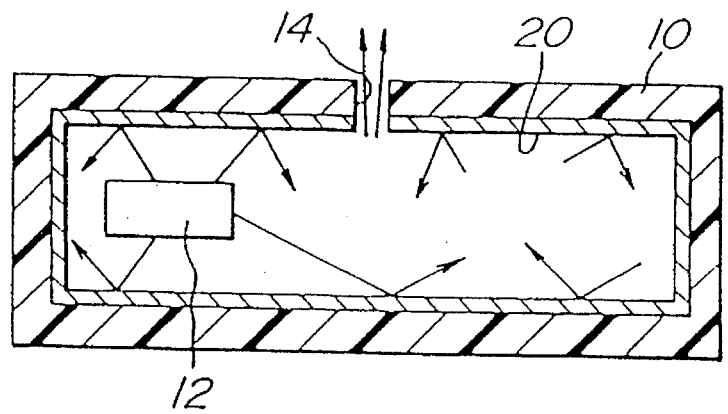
FIG_2
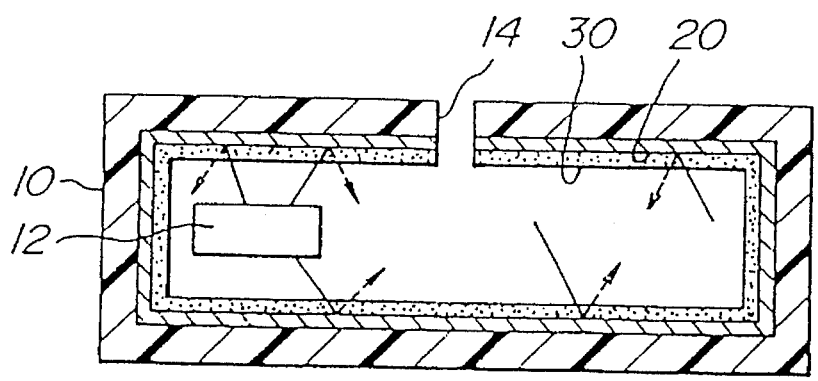
FIG_3
PRIOR ART
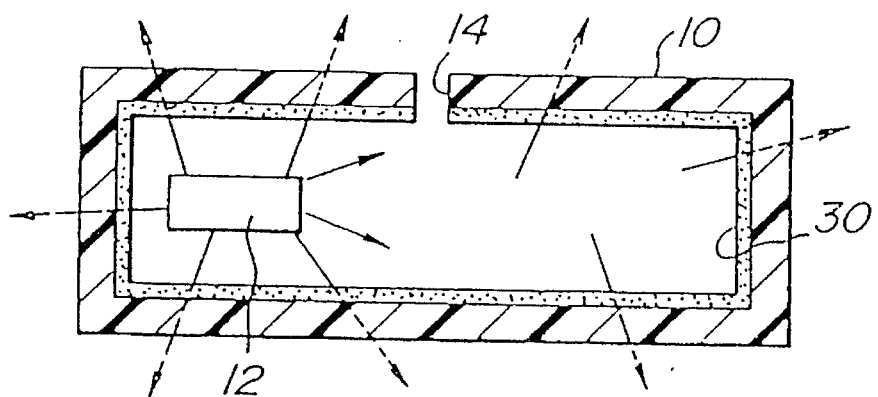

Frequency (GHz) (Mn-Mg-Zn Ferrite)

Frequency (GHz) (Mn-Zn Ferrite)

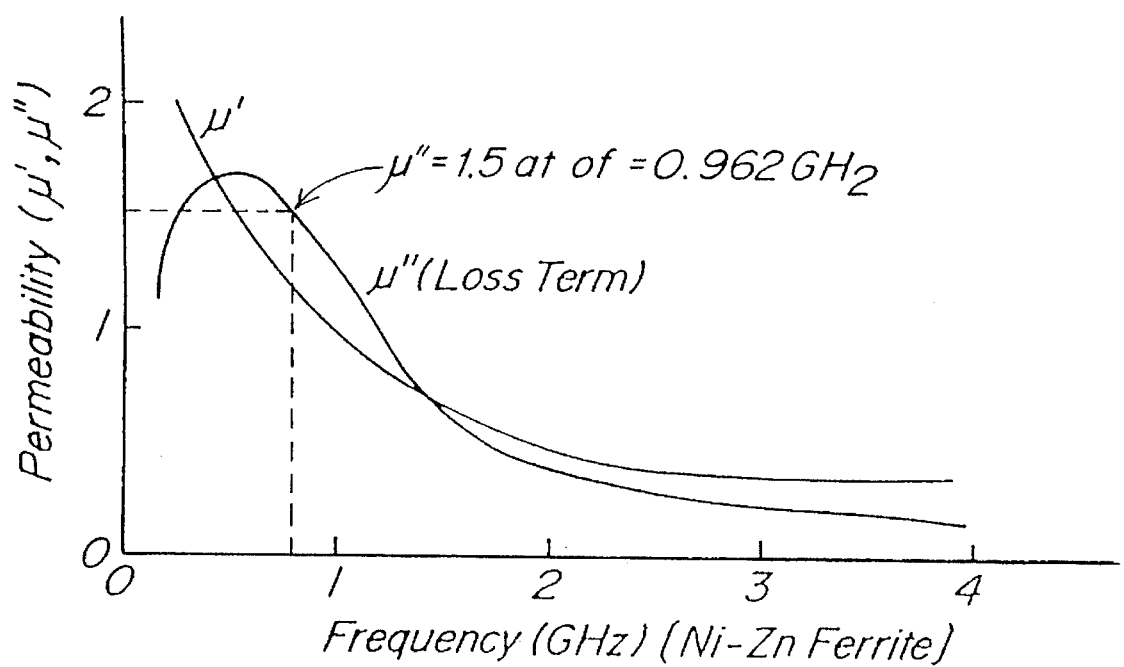
FIG_6

ELECTRONIC APPARATUS CASE HAVING AN ELECTRO-MAGNETIC WAVE SHIELDING STRUCTURE

This application is a continuation-in-part of application Ser. No. 08/117,756, filed Sep. 8, 1993.

BACKGROUND OF THE INVENTION

1. Field of the Invention

The present invention relates to an electro-magnetic wave shielding structure for preventing undesired leakage of an electro-magnetic wave, particularly, for preventing an electric wave obstruction in the surrounding environment, which is caused by undesired leakage of an electro-magnetic wave generated in an electric apparatus including a communication apparatus, for instance, a car telephone, a portable telephone and the like.

2. Related Art Statement

Recently, cases or housings of electric apparatus of various kinds have a tendency to be formed of plastics which are superior in that they are light weight and have desirable plasticity.

On the other hand, inner circuits and electric parts, which are comprised in electric apparatus, include articles which generate undesired electro-magnetic waves causing electric wave obstructions. Particularly, communication apparatus, information apparatus, electronic apparatus comprising integrated circuits and the like include many articles which deal with high frequency electric signals together with a high possibility for causing the leakage of high frequency electric waves originating electric wave obstructions.

Accordingly, when the aforesaid case of electric apparatus is formed of plastics having a general property such that an electro-magnetic wave passes therethrough, the aforesaid undesired leakage of the electro-magnetic wave is extremely increased and hence the occurrence of electric wave obstruction becomes a very severe problem.

Indeed, when special plastics provided for shielding the electro-magnetic wave by containing metal powders or the like therein are employed as for the plastics forming the aforesaid case, the leakage of electro-magnetic waves can be prevented to a certain extent.

However, such special plastics are expensive in terms of material costs and further the performances thereof, including plasticity, are lowered, so that the advantage of the case made of plastics cannot be sufficiently obtained.

Therefore, a measure involving applying a conductive layer formed by metal plating or painting a conductive material on the plastics case has been conventionally proposed. A thus applied conductive layer has a property wherein the electro-magnetic wave is reflected thereby. As a result, an electro-magnetic wave generated in the case can be prevented from the being undesirably leaked from the case made of plastics according to the reflection attained by the conductive layer applied thereon.

FIG. 1 shows an outline of an electric apparatus comprising a conventional electro-magnetic wave shielding structure. In FIG. 1, an electro-magnetic wave reflecting layer 20, which is formed of a metalplating layer and the like, is applied on an inner face of a case 10 made of plastics, so that an electromagnetic wave generated in an electro-magnetic wave generating source 12 is reflected at inner faces of the reflecting layer 20 as indicated by arrow marks, so as to be prevented from passing through the case 10 and leaking to the environment.

However, even if the electro-magnetic reflecting layer is formed on the inner face of the plastic made case as described above, leakage of electromagnetic waves nevertheless occurs to an unacceptable level so that improvement of this leakage preventing measure has been demanded.

In further detail, in the case formed of plastics, the leakage of electro-magnetic waves is not caused at portions on which the reflecting layers are applied. However, the case of the electric apparatus is provided with a ventilating hole, an internal inspection hole and other holes, so that the electro-magnetic wave leaks through these holes. The electro-magnetic wave in a frequency region in an order of 1 GHz, which has a large possibility of generation inside the electric apparatus and further a large effect of electric wave obstruction, can be readily leaked even from a minute opening and a minute gap which exist in the case. As a result, it has been difficult to cut the leakage of electro-magnetic waves in the high frequency region.

Moreover, when the electro-magnetic wave reflecting layer has been applied on the inner face of the case made of plastics, the electro-magnetic wave generated in the case is moved entirely within the case by being repeatedly reflected on the reflecting layer with the result that it is concentrically leaked through the openings. Furthermore, the conductive electro-magnetic wave reflecting layer is operated as if it were a half wavelength antenna, with the result that the electro-magnetic wave emitted from the local oscillator inside the case is secondarily emitted therefrom. Consequently, the provision of the electro-magnetic wave reflecting layer cannot have been useful as an effective electromagnetic wave shielding measure.

In other words, as is shown in FIG. 1, when an opening 14 exists in a portion of the case 10, the electro-magnetic wave being repeatedly reflected by the electro-magnetic wave reflecting layer 20 inside the case 10 reaches to the portion on which the opening 14 exists, and hence readily passes through the opening 14 to the outside thereof. The electro-magnetic wave is hardly attenuated so long as it is reflected by the reflecting layer 20, so that the major part of the electromagnetic wave energy generated from an electromagnetic wave generating source 12 is possibly leaked through the opening 14 to the outside thereof.

SUMMARY OF THE INVENTION

An object of the present invention is to dispose of the task of the conventional electro-magnetic wave shielding structure as discussed above, by providing an electro-magnetic wave shielding structure which can effectively prevent the leakage of electro-magnetic waves, even I an opening exists on the case of the electric apparatus.

Accordingly, the present invention provides an electromagnetic wave shielding structure for a case having an inner surface, said structure comprising:

a conductive film disposed on the inner surface of the case; and a magnetically lossy layer disposed on the conductive film, the conductive film being disposed between the magnetically lossy layer and the inner surface of said case, the magnetically lossy layer containing ferrite particles, having a thickness (d) of 80 to 300 μm and a loss term (μ") of relative magnetic permeability of not less than 1.9 and satisfying the following inequality:

$$\mu" \times f \times d \geq 145,$$

wherein f is a frequency (in GHz) of an incident electromagnetic wave and d is in units of μm.

Consequently, in the electro-magnetic wave shielding structure of the present invention, even if openings for leaking electro-magnetic waves exist on a case accommodating electronic circuits providing electro-magnetic wave generating sources, it is possible to mitigate the occurrence of electric wave obstruction by readily preventing the undesired leakage of electro-magnetic waves.

BRIEF DESCRIPTION OF THE DRAWINGS

For better understanding of the invention, reference is made to the accompanying drawings, in which:

FIG. 1 is a cross-sectional view schematically showing an example of a conventional electro-magnetic wave shielding structure;

FIG. 2 is a cross*sectional view showing an outlined arrangement of an electro-magnetic wave shielding structure according to the present invention;

FIG. 3 is a cross-sectional view schematically showing another example of the conventional electro-magnetic wave shielding structure;

FIG. 6 is a graph showing a frequency characteristics of relative magnetic permeability in a third embodiment of the present invention.

Figure 4:
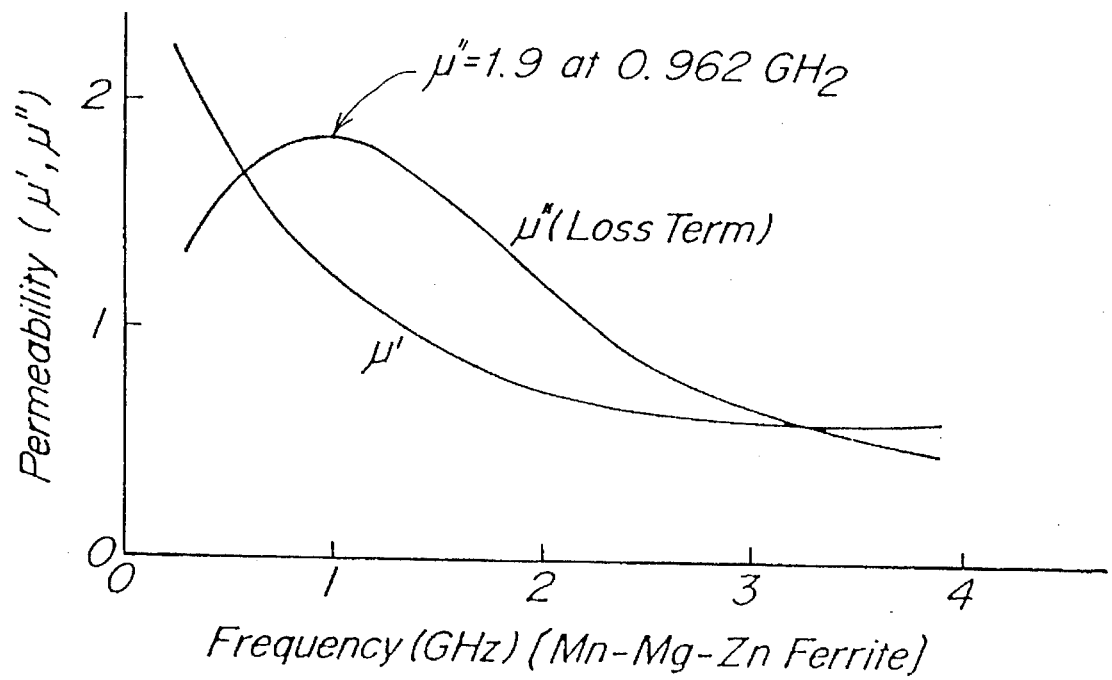
FIG. 4 is a graph showing a frequency characteristics of relative magnetic permeability in a first embodiment of the present invention.

Throughout different views of the drawings, 10 is a case, 12 is an electro-magnetic wave generating source, 14 is an opening, 20 is an electro-magnetic wave reflecting layer (a conductive layer), and 30 is an electro-magnetic wave absorbing layer (a magnetically losing layer).

DESCRIPTION OF THE PREFERRED EMBODIMENTS

Preferred embodiments of the present invention will be described in detail by referring to the accompanying drawings hereinafter.

An electro-magnetic wave shielding structure according to the present invention has a shielding arrangement for preventing leakage of an electro-magnetic wave generated in a case of an electric apparatus. In a first embodiment thereof, conductive films are formed on inner faces of the case made of an electro-magnetic wave passing-through material, on surfaces of which are formed magnetically lossy layers of a thickness of 80 to 300 μm which generally contain Mn—Mg—Zn group soft ferrite particles having an average diameter of 1 to 20 μm by 70 to 90 weight % are formed.

Electric apparatus to be adopted to have the present invention applied thereto include electric apparatus comprising electronic circuits which have the possibility for generating electro-magnetic waves, for instance, the aforesaid communication apparatus including portable telephones, information apparatus and the like, electric apparatus in any technical field and for any use.

In general, the case of the electric apparatus is formed of an electro-magnetic wave passing-through material, for instance, plastics, for which any usual molding resin can be used, and further woody materials and inorganic materials other than plastics, which are used in general for the case construction of apparatus of various kinds, can be employed also. As for the shape and the construction of the case, any shape and any construction which are adapted for the whole construction, can be adopted.

In this connection, it is generally required for the faculty of the electric apparatus that openings including a slit, a hole, a recess and the like exist at least on a part of the case.

As for the conductive layer formed on the inner faces of the case, usual electro-magnetic wave reflecting materials which have been used for the electro-magnetic shielding structure as conventionally proposed also are employed, while, as the method for forming the conductive layer on inner faces of the case, usual methods can be employed. In practice, various methods can be employed such as plating with good conductive metals (for instance, copper, aluminum or the like) with thin films of such metals being formed by depositing the metals, applying foils of the metals, spreading various kinds of conductive paints obtained by mixing metal powders into the paints, or, applying films formed of conductive resin being put on with adhesive or materials.

In this regard, the thickness of these conductive layers is enough to achieve reflectivity to prevent electro-magnetic wave passing though the magnetically lossy layer formed on the inner face of the case (as discussed below) from passing through towards the case. In concrete practice, although being different in response to the kinds and the amount of the electro-magnetic waves generated in the case and further their combination with electro-magnetic absorbing layers, the conductive layers applied in the usual condition are provided with a thickness of 40 to 70 μm.

On the other hand, the magnetically lossy layer formed on the surface of the conductive layer is provided with a property such that the loss term of the relative magnetic permeability thereof has a substantially maximum value at the frequency of the undesired leakage electro-magnetic wave, and, further concretely speaking, that the electric current path from the electro-magnetic wave generating portion of the electronic circuit to the openings thereof is largely varied through the resistance based on the loss term. As a result, the larger the magnetic loss term is, the more effectively the emission from the conductive layer is suppressed.

In this connection, as for this magnetic loss term, an article which does not entirely reflect the electro-magnetic wave is desired. However, for the practical use, a material having a property such as low reflectivity of the electro-magnetic wave and high magnetic loss in comparison with the aforesaid conductive layer is preferably used for forming it.

In the first embodiment of the present invention, as for the magnetically lossy layer having the aforesaid property, a magnetically lossy layer of the thickness of 80 to 300 μm which generally contains Mn—Mg—Zn group soft ferrite particles having an average diameter of 1 to 20 μm by 70 to 85 weight % is employed. This Mn—Mg—Zn group soft ferrite particle consists of the so called soft ferrite formed by the combination of $Fe_2O_3$ with ZnO, MgO, MnO and others, while the crystal structure thereof is of spinel type. In this connection, as for this soft ferrite particle, an average diameter of the particle may be 1 to 20 μm.

For forming a thin film of aforesaid soft ferrite particles on the surface of the conductive layer applied inside the case, it is enough to apply an article made by mixing or kneading these particles with a binder of resin or the like.

In this regard, it can be adopted also that a film of resin containing soft ferrite particles is previously prepared and then this magnetically lossy film is applied.

In this connection, the larger the percentage of soft ferrite particles to be occupied in this magnetically lossy layer is, the better the performance of electro-magnetic wave performance becomes. However, for facilitating the formation of this layer through spreading or the like, it is required to contain resin and others at a certain large percentage. So that, it is preferable from this point of view that soft ferrite particles are contained by 70 to 90 weight %.

On the other hand, as for the resin to be mixed with soft ferrite particles for forming the electro-magnetic wave absorbing layer, any kind of resin can be adopted so long as the formation of the layer through spreading and the like can be preferably attained.

For instance, painting resins including acryl, epoxy, urethane, alkyd and others, or, film-forming resins including vinyl chloride and others can be adopted. Meanwhile, the thicker the magnetically lossy layer is, the better the faculty of electro-magnetic wave attenuation becomes.

In the first embodiment of the present invention, for sufficiently manifesting the faculty of electro-magnetic wave attenuation, the thickness of the magnetically lossy layer is arranged to be within the range of 80 to 300 μm, preferably 100 to 300 μm. It is difficult to form the magnetically lossy layer with a thickness of more than 300 μm, and the resulting layer does not function sufficiently. If a thickness is less than 80 μm, the layer does not act sufficiently. Thus, an appropriate thickness of this layer should be selected through these various conditions.

It has been found that, when a magnetically lossy film is disposed on the surface of a conductive layer, a resistance (z) drived from an electro-magnetic wave passing through the magnetically lossy layer and incident into the conductive layer is in proportion to f (frequency in GHz of the incident electro-magnetic wave)×μ" (loss term of relative magnetic permeability of magnetically lossy layer)×d (thickness in μm of magnetically lossy layer).
That is $$Z \propto f \times \mu'' \times d$$

The larger the value of Z is, the better the magnetic wave shielding properties are. It has been found from some experimental data shown in the following Examples 1 to 9 and Comparative Examples 1 to 6 that:

$$f \times \mu'' \times d \geq 145 (GHz, \mu m)$$

As described above, according to the present invention, when two kinds of layers, that is, the conductive layer and the magnetically lossy layer are doubly formed inside the case consisting of the electro-magnetic wave passing-through material, firstly, the leakage of electro-magnetic waves through the portion covered with the conductive layer is prevented by the electro-magnetic wave reflecting action thereof, and further, secondarily, the undesired leakage of electro-magnetic waves emitted from the conductive layer acting as an emitter through minute openings and slits which exist on the case is largely attenuated through the resistance based on the magnetically lossy layer doubly disposed on the conductive layer.

As a result, in the electro-magnetic wave shielding structure according to the present invention, even if the case formed of electro-magnetic wave passing-through material, for instance, plastics, is employed and further openings exist on a part thereof, electro-magnetic waves do not leak out of the case, so that extremely advantageous electro-magnetic wave shielding can be attained.

An outlined arrangement of the electro-magnetic wave shielding structure according to the present invention is schematically shown in FIG. 2. In this outlined structure, an electro-magnetic wave generating source 12, for instance, a high frequency circuit, is provided in a case 10 formed of an electro-magnetic passing-through material, for instance, plastics. From this generating source 12, electro-magnetic waves are emitted towards the surroundings as indicated by arrow marks. An opening 14 is provided on a part of the case 10, whilst a conductive layer 20 and a magnetically lossy layer 30 are subsequently formed inside the case 10.

In the above-outlined arrangement, the electro-magnetic wave emitted from the source 12 is absorbed by the magnetically lossy layer 30 and hence is attenuated, while the electro-magnetic wave passing through the magnetically lossy layer 30 is reflected by the conductive layer 20 and hence cannot reach case 10 disposed outside the conductive layer 20. Consequently, the electro-magnetic wave leaking through the opening 14 becomes extremely scarce.

It is a necessary condition for the present invention that both the conductive layer 20 and the magnetically lossy layer 30 are formed on the inner face of the case 10, as is apparent from FIG. 2 in comparison with FIG. 3 showing another conventional arrangement. In the arrangement provided with the magnetically lossy layer 30 only inside the case 10 as shown in FIG. 3, a major part of the electro-magnetic wave saved from the absorption through the magnetically lossy layer 30 reaches the case 10 proper, and then readily leaks to the outside through the hole 14 in case 10, which is conventionally formed of an electro-magnetic wave passing-through material.

The magnetically lossy layer 30 cannot perfectly absorb the electro-magnetic wave in practice, so that a part of the electro-magnetic wave cannot help passing through the magnetically lossy layer 30. Accordingly, it is extremely effective that, according to the present invention, the conductive layer 20 is provided outside the magnetically lossy layer 30, so as to reflect the electro-magnetic wave passing through the magnetically lossy layer 30 by the conductive layer 20 for preventing such wave from reaching case 10.

Next, further concrete embodiments of the present invention will be described hereinafter. As a preferable example of the electric apparatus to be applied with the present invention, a portable telephone accommodated in a case, which is formed of Pc/ABS polymer alloy resin and provided with openings for a mouthpiece and a phone, is adopted. As for the conductive layer, a conductive paint belonging to the Cu—Ag/acryl resin group is spread inside the case with a thickness of 40 to 70 μm.

In the aforesaid first embodiment (Examples 1 to 3), as for the magnetically lossy layer, a spread film consisting of Mn—Mg—Zn group soft ferrite particles and resin is formed on the conductive layer. The Mn—Mg—Zn group soft ferrite particles consist of $Fe_2O_3$ of 45 weight parts, ZnO of 20 weight parts, MgO of 28 weight parts and MnO of 7 weight parts and have an average diameter as shown in Table 1. A paint formed by dispersing soft ferrite particles of 80 weight % and acryl resin group varnish of 20 weight % into a solvent is spread by air-spray and then dried, so as to form the electro-magnetic absorbing layer.

A portable telephone was constructed with use of the case on the inner face on which the conductive layer and the magnetically lossy layer were applied. Thereafter, the leakage of an electro-magnetic wave which was generated inside the case during the operation of this telephone was measured as described below with regard to the intensity thereof at the frequency 962 MHz, which frequency was customarily generated in the portable telephone of this kind and frequently caused serious electric wave obstruction.

As Comparative Examples 1 and 2, the kinds of soft ferrite particles differ from Examples 1 to 3, as shown in Table 1.

Figure 5:
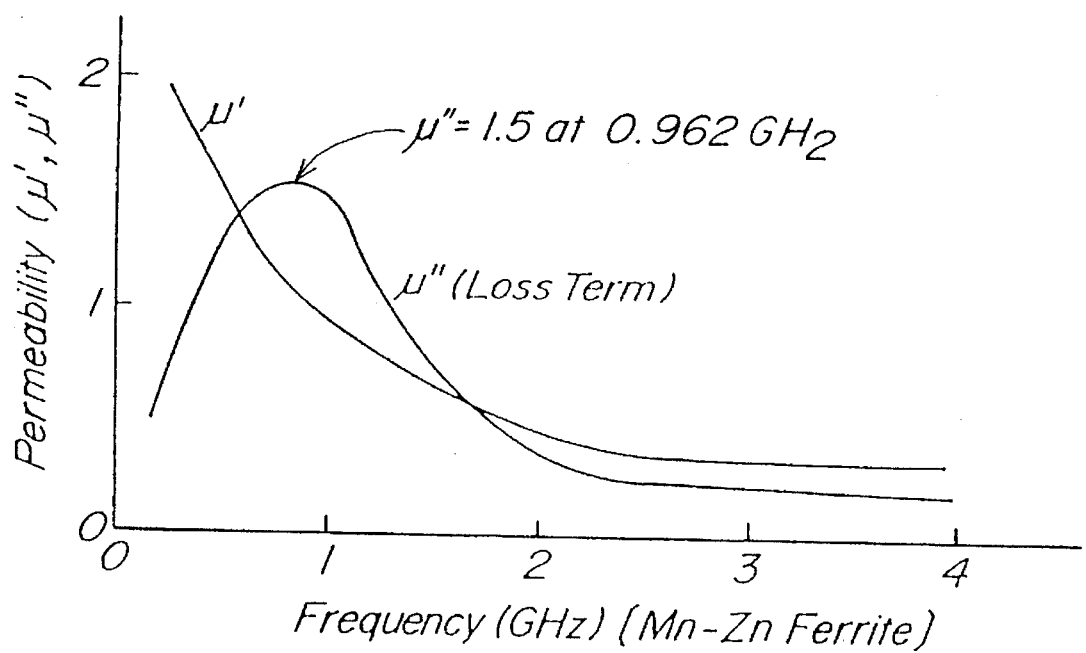
FIG. 5 is a graph showing the frequency characteristics of relative magnetic permeability in a second embodiment of the present invention.

Respective frequency characteristics of relative magnetic permeability in Example 1 and comparative Examples 1 and 2 are shown in FIGS. 4, 5 and 6 respectively.

Table 1 shows the kinds of soft ferrite particles used, average particle diameter, layer thickness, their content, $f\mu''$, $f\mu''d$ and intensity of leaked electro-magnetic wave. As is apparent from Table 1, Comparative Example 3 shows that no magnetically lossy layer is provided on the conductive layer 20.

Table 2 shows different data in which soft ferrite particles are Mn—Mg—Zn group but content in the magnetically lossy layer is different, as Examples 4 to 6 and Comparative Examples 4 and 5.

Table 3 also shows different data in which a thickness of the magnetically lossy layer is changed but the other conditions are fixed, as Comparative Example 6 and Examples 7 to 9. In this connection, as for the composition of the soft ferrite particle, it is preferable to select an article such that the loss term $\mu''$ of the permeability presents substantially the maximum value in the frequency region of the undesired electro-magnetic wave.

TABLE 2

Difference based on Content of Soft Ferrite Particles

| Example No. | Layer content (weight %) | $f \times \mu'' \times d$ (at 0.962 GHz) | Electro-magnetic wave intensity (dB) |
|---|---|---|---|
| Comparative Example 4 | 50 | 87 | −76 |
| Comparative Example 5 | 60 | 90 | −76 |
| Example 4 | 70 | 145 | −80 |
| Example 5 | 85 | 269 | −85 |
| Example 6 | 90 | 289 | −85 |

In this regard, the soft ferrite particle belongs to the Mn—Mg—Zn group and the thickness of the layer is 100 μm.

According to the above-measured results, when the content of the soft ferrite particle is less than 70 weight %, (i.e. $f \times \mu'' \times d < 145$) the effect of the further provision of the magnetically lossy layer can be scarcely obtained, while the electro-magnetic wave shielding faculty is improved by the increase of such content (i.e. $f \times \mu'' \times d \geq 145$). Meanwhile, when the content concerned exceeds 90 weight %, the operability is reduced by the difficult formation of the film,

TABLE 1

Difference based on Kinds of Soft Ferrite Particles

| | Kind of soft ferrite particle | Average particle diameter (μm) | Layer thickness (μm) | Layer content (weight %) | $f \times \mu''$ at 0.962 GHz | $f \times \mu'' \times d$ | Electro-magnetic wave intensity (dB) |
|---|---|---|---|---|---|---|---|
| Example 1 | Mn—Mg—Zn group | 2 | 100 | 80 | 1.83 | 183 | −84 |
| Example 2 | Mn—Mg—Zn group | 5 | 100 | 80 | 2.02 | 202 | −84 |
| Example 3 | Mn—Mg—Zn group | 20 | 100 | 80 | 1.92 | 192 | −84 |
| Comparative Example 1 | Mn—Zn group | 5 | 100 | 80 | 1.44 | 144 | −75 |
| Comparative Example 2 | Ni—Zn group | 5 | 100 | 80 | 1.44 | 144 | −78 |
| Comparative Example 3 | — | — | 0 | — | 0 | 0 | −75 |

In this regard, the reference example as shown in this table indicates that the larger the minus numerical value of the electric wave intensity becomes, the larger the electric wave attenuation is and hence the lesser the leaked electric wave is.

According to the above measured results, in Examples 1 to 3 in which the magnetically lossy layer containing Mn—Mg—Zn group soft ferrite particles is formed, the improvement of electro-magnetic wave shielding faculty, which is attained by 6 to 9 dB in comparison with Comparative Example 1 and 2 in which the magnetically lossy layer containing another soft ferrite particle is formed, and Comparative Example 3 in which the conductive layer only is formed, has been obtained.

so that practical usability is frequently reduced.

TABLE 3

Difference based on Layer Thickness of Absorbing Layer ($f\mu'' = 1.83$ at 0.962 GHz)

| Example No. | Layer thickness (μm) | $f \times \mu'' \times d$ at 0.962 GHz | Electro-magnetic wave intensity (dB) |
|---|---|---|---|
| Comparative Example 6 | 50 | 92 | −78 |
| Example 7 | 80 | 146 | −82 |
| Example 8 | 200 | 366 | −85 |
| Example 9 | 300 | 549 | −86 |

In this regard, the soft ferrite particle belongs to the Mn—Mg—Zn group and the content thereof is fixed 80 weight %.

According to the above measured results, it is apparent that, when the thickness of the magnetically lossy layer exceeds 80 μm (i.e. f×μ"×d≧145), a sufficient electro-magnetic wave shielding effect can be obtained. If a layer thickness exceeds 300 μm, the appearance of the magnetically lossy layer is very poor and it is very difficult to measure the evaluations.

As is apparent from the above described, in the electro-magnetic wave shielding structure according to the present invention, it is possible to remarkably reduce the level of undesired electro-magnetic waves leaked from the case formed of electro-magnetic wave passing-through material by combining the magnetically lossy layer containing soft ferrite particles and the conductive layer. Particularly, in the conventional electro-magnetic waves shielding structure applied with the conductive reflecting layer only, the undesired leakage of electro-magnetic waves has been concentrically caused through the opening portions provided in the case. On the other hand, in the electro-magnetic wave shielding structure according to the present invention, it is facilitated to securely prevent the undesired leakage of electro-magnetic waves through those opening portions, and further to securely shield electro-magnetic waves in the frequency region on the order of 1 GHz which is difficult to be shielded according to the conventional manufacturing technique of the electric apparatus.

Consequently, as for the electric apparatus in which the undesired electro-magnetic wave is frequently generated, for instance, the communication apparatus and the information apparatus which are recently utilized in various technical fields, it is facilitated that the electric wave obstruction toward the surrounding environment is steadily prevented and hence demand for and use of these electric apparatus are greatly increased thereby.

We claim:

1. A case having an electromagnetic wave shielding structure, comprising:
    a conductive film disposed on an inner surface of said case; and
    a magnetically lossy layer disposed on said conductive film, said conductive film being disposed between said magnetically lossy layer and said inner surface of said case,
    said magnetically lossy layer containing ferrite particles, having a thickness (d) of 80 to 300 μm and a loss term (μ") of relative magnetic permeability of not less than 1.9 and satisfying the following inequality:
    μ"≧145/(f×d)
    where f is a frequency given in GHz of an incident electro-magnetic wave and d is given in μm, wherein said ferrite particles have an average diameter of 1 to 20 μm.

2. An electromagnetic wave shielding structure according to claim 1, wherein said ferrite particles are Mn—Mg—Zn group soft ferrite particles.

3. An electromagnetic wave shielding structure according to claim 1, wherein said conductive film has a thickness of about 40–70 μm.

4. An electromagnetic wave shielding structure according to claim 1, wherein said conductive film comprises a resin selected from a Cu-Ag/acryl resin group.

5. An electromagnetic wave shielding structure according to claim 4, wherein said conductive film has a thickness of about 40–70 μm.

6. An electromagnetic wave shielding structure comprising:
    a conductive film disposed on an inner surface of said case; and
    a magnetically lossy layer disposed on said conductive film, said conductive film being disposed between said magnetically lossy layer and said inner surface of said case,
    said magnetically lossy layer containing ferrite particles, having a thickness (d) of 80 to 300 μm and a loss term (μ") of relative magnetic permeability of not less 1.9 and satisfying the following inequality:
    μ"≧145/(f×d)
    where f is a frequency given in GHz of an incident electro-magnetic wave and d is given in μm, wherein said ferrite particles comprise 70–90% by weight of said magnetically lossy layer.

7. An electromagnetic wave shielding structure according to claim 6, wherein said ferrite particles are Mn—Mg—Zn group soft ferrite particles.

8. An electromagnetic wave shielding structure according to claim 6, wherein said conductive film has a thickness of about 40–70 μm.

9. An electromagnetic wave shielding structure according to claim 6, wherein said conductive film comprises a resin selected from a Cu-Ag/acryl resin group.

10. An electromagnetic wave shielding structure according to claim 9, wherein said conductive film has a thickness of about 40–70 μm.

* * * * *